(12) United States Patent
Han et al.

(10) Patent No.: US 12,195,846 B2
(45) Date of Patent: Jan. 14, 2025

(54) MODIFIED STACKS FOR 3D NAND

(71) Applicant: Applied Materials, Inc., Santa Clara, CA (US)

(72) Inventors: Xinhai Han, Santa Clara, CA (US); Hang Yu, San Jose, CA (US); Kesong Hu, Pleasanton, CA (US); Kristopher R. Enslow, Carlsbad, CA (US); Masaki Ogata, San Jose, CA (US); Wenjiao Wang, San Jose, CA (US); Chuan Ying Wang, Sunnyvale, CA (US); Chuanxi Yang, Los Altos, CA (US); Joshua Maher, Sunnyvale, CA (US); Phaik Lynn Leong, Singapore (SG); Grace Qi En Teong, Singapore (SG); Alok Jain, Singapore (SG); Nagarajan Rajagopalan, Santa Clara, CA (US); Deenesh Padhi, Sunnyvale, CA (US); SeoYoung Lee, Hwaseong-si (KR)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 16/986,632

(22) Filed: Aug. 6, 2020

(65) Prior Publication Data
US 2021/0040607 A1    Feb. 11, 2021

Related U.S. Application Data

(60) Provisional application No. 62/884,034, filed on Aug. 7, 2019.

(51) Int. Cl.
*C23C 16/00*  (2006.01)
*C23C 16/34*  (2006.01)
(Continued)

(52) U.S. Cl.
CPC .......... *C23C 16/345* (2013.01); *C23C 16/401* (2013.01); *H10B 41/20* (2023.02);
(Continued)

(58) Field of Classification Search
CPC ...................................................... H01L 21/00
See application file for complete search history.

(56) References Cited

U.S. PATENT DOCUMENTS

| 5,272,361 A | * | 12/1993 | Yamazaki | ........... | H01L 29/1054 |
| | | | | | 257/411 |
| 5,460,999 A | * | 10/1995 | Hong | ................ | H01L 27/10817 |
| | | | | | 438/739 |

(Continued)

FOREIGN PATENT DOCUMENTS

| JP | 2016197719 A | 11/2016 |
| JP | 2019004146 A | 1/2019 |

(Continued)

OTHER PUBLICATIONS

International Search Report and Written Opinion mailed Nov. 17, 2020 in International Patent Application No. PCT/US2020/045087, 9 pages.

(Continued)

*Primary Examiner* — Kelly M Gambetta
*Assistant Examiner* — Mohammad Mayy
(74) *Attorney, Agent, or Firm* — Kilpatrick Townsend & Stockton LLP

(57) ABSTRACT

Exemplary methods of forming semiconductor structures may include forming a silicon oxide layer from a silicon-containing precursor and an oxygen-containing precursor. The methods may include forming a silicon nitride layer from a silicon-containing precursor, a nitrogen-containing precursor, and an oxygen-containing precursor. The silicon nitride layer may be characterized by an oxygen concentra- (Continued)

tion greater than or about 5 at. %. The methods may also include repeating the forming a silicon oxide layer and the forming a silicon nitride layer to produce a stack of alternating layers of silicon oxide and silicon nitride.

12 Claims, 4 Drawing Sheets

(51) Int. Cl.
    *C23C 16/40*     (2006.01)
    *H10B 41/20*     (2023.01)
    *H10B 41/35*     (2023.01)
    *H10B 43/20*     (2023.01)
    *H10B 43/35*     (2023.01)

(52) U.S. Cl.
    CPC ............ *H10B 41/35* (2023.02); *H10B 43/20* (2023.02); *H10B 43/35* (2023.02)

(56) References Cited

U.S. PATENT DOCUMENTS

| | | | | |
|---|---|---|---|---|
| 6,255,233 B1* | 7/2001 | Smith | ................ | H01L 21/0217 438/791 |
| 2001/0004121 A1* | 6/2001 | Sakama | ............. | H01L 27/1248 257/E27.111 |
| 2003/0183875 A1* | 10/2003 | Isobe | ................ | H01L 21/02425 257/E29.295 |
| 2008/0220570 A1* | 9/2008 | Ohnuma | ............. | H01L 27/1281 438/166 |
| 2009/0079025 A1* | 3/2009 | Yamazaki | ................ | H01L 25/50 257/E21.567 |
| 2012/0012920 A1* | 1/2012 | Shin | .................... | H01L 29/4234 257/E29.262 |
| 2014/0159035 A1* | 6/2014 | Park | .................... | H01L 29/7869 257/43 |
| 2016/0172366 A1 | 6/2016 | Koka et al. | | |
| 2016/0225616 A1 | 8/2016 | Li et al. | | |
| 2016/0293410 A1* | 10/2016 | Lei | ......................... | C07F 5/022 |
| 2017/0200732 A1 | 7/2017 | Horiguchi | | |
| 2018/0102256 A1* | 4/2018 | Chen | ................ | H01L 21/02323 |
| 2019/0229128 A1 | 7/2019 | Tsiang et al. | | |

FOREIGN PATENT DOCUMENTS

| | | |
|---|---|---|
| KR | 2015-0040805 A | 4/2015 |
| KR | 2015-0116896 A | 10/2015 |
| TW | 2012-20366 A | 5/2012 |

OTHER PUBLICATIONS

International Preliminary Report on Patentability mailed on Feb. 17, 2022 in International Patent Application No. PCT/US2020/045087, 6 pages.

* cited by examiner

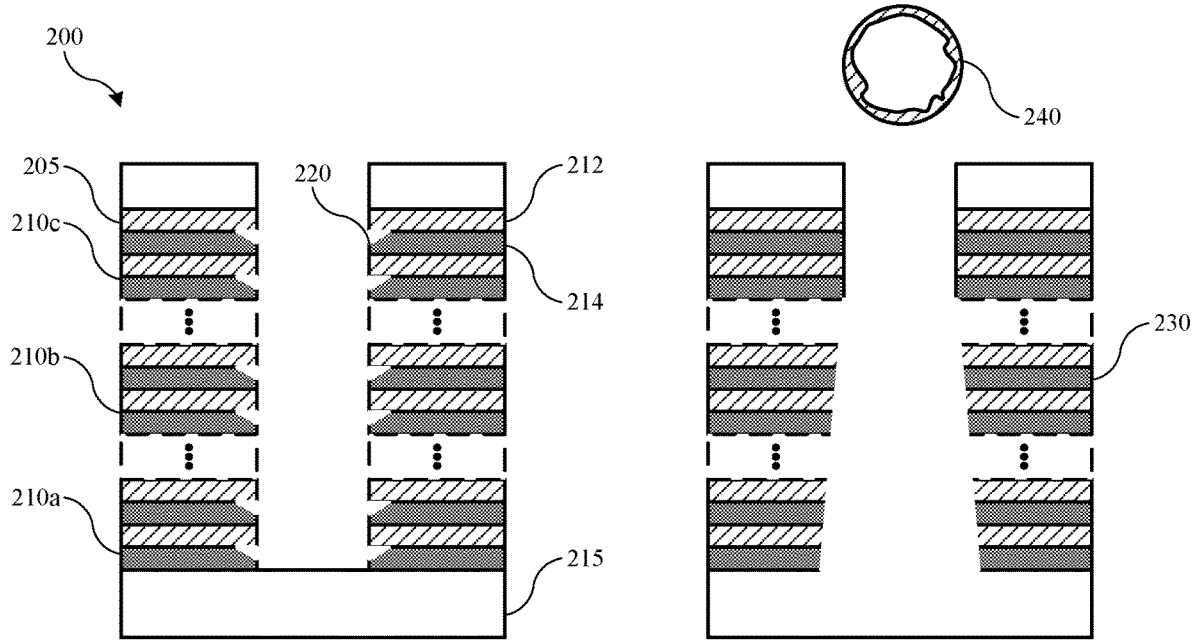
*FIG. 2A*            *FIG. 2B*
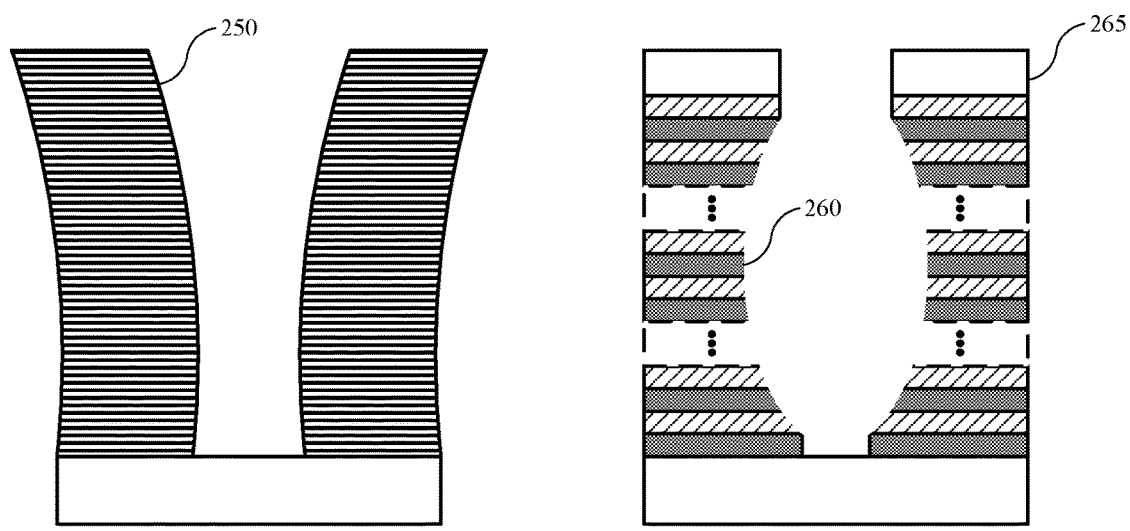
*FIG. 2C*            *FIG. 2D*

MODIFIED STACKS FOR 3D NAND

CROSS-REFERENCE TO RELATED APPLICATIONS

The present application claims the benefit of, and priority to U.S. Provisional Patent Application No. 62/884,034, filed Aug. 7, 2019, the contents of which are hereby incorporated by reference in their entirety for all purposes.

TECHNICAL FIELD

The present technology relates to semiconductor processes and materials. More specifically, the present technology relates to forming alternating layer film stacks.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Material properties of the layers of materials, as well as process conditions and materials for etching, may affect the uniformity of the formed structures. Material defects may lead to inconsistent patterning, which may further affect the uniformity of the formed structures.

Thus, there is a need for improved systems and methods that can be used to produce high quality devices and structures. These and other needs are addressed by the present technology.

SUMMARY

Exemplary methods of forming semiconductor structures may include forming a silicon oxide layer from a silicon-containing precursor and an oxygen-containing precursor. The methods may include forming a silicon nitride layer from a silicon-containing precursor, a nitrogen-containing precursor, and an oxygen-containing precursor. The silicon nitride layer may be characterized by an oxygen concentration greater than or about 5 at. %. The methods may also include repeating the forming a silicon oxide layer and the forming a silicon nitride layer to produce a stack of alternating layers of silicon oxide and silicon nitride.

In some embodiments, the oxygen-containing precursor of the forming a silicon oxide layer and the oxygen-containing precursor of the forming a silicon nitride layer may be the same or similar precursors. The stack of alternating layers may include a first portion of the stack including the silicon oxide layer and the silicon nitride layer and a second portion of the stack overlying the first portion of the stack. Producing the second portion of the stack may include forming a silicon nitride layer from the silicon-containing precursor and the nitrogen-containing precursor, and an oxygen-containing precursor. The silicon nitride layer may be characterized by an oxygen concentration different from the oxygen concentration of the silicon nitride layer in the first portion of the stack. The oxygen concentration of the silicon nitride layer may be between about 10 at. % and about 30 at. %, and a nitrogen atomic percent may be greater than or about 30 at. %.

Forming the silicon nitride layer may include flowing the silicon-containing precursor and the nitrogen-containing precursor into a substrate processing region. Forming the silicon nitride layer may include forming an amount of silicon nitride. Forming the silicon nitride layer may include adding the oxygen-containing precursor while continuing to form silicon nitride. The oxygen-containing precursor may be flowed at a constant flow rate, and the silicon nitride layer formed may be or include a bi-layer of silicon nitride substantially free of oxygen and silicon nitride characterized by an oxygen concentration greater than or about 5 at. %. The oxygen-containing precursor may be flowed at a varying flow rate, and the silicon nitride layer formed may include a gradient of oxygen concentration through the silicon nitride layer. A flow rate of oxygen-containing precursor may be increased during the adding the oxygen-containing precursor. The methods may include forming one or more features through the stack of alternating layers of silicon oxide and silicon nitride. A lateral removal of the silicon nitride layer at an interface of the silicon nitride layer and an overlying silicon oxide layer may extend a distance less than or about 50% of a distance corresponding to a thickness of the silicon nitride layer.

Some embodiments of the present technology may encompass semiconductor structures. The structures may include a stack of layers overlying a semiconductor substrate. The stack of layers may include a first portion of layers including alternating layers of a silicon oxide material and a silicon nitride material. The stack of layers may include a second portion of layers overlying the first portion of layers, and the second portion of layers may include alternating layers of a silicon oxide material and a silicon nitride material. The stack of layers may include a third portion of layers overlying the second portion of layers, and the third portion of layers may include alternating layers of a silicon oxide material and a silicon nitride material. The structures may include one or more apertures formed through the stack of layers to the substrate. A lateral notch in each individual layer of silicon nitride material at an interface of the individual layer of silicon nitride material and an overlying layer of silicon oxide material may extend a distance less than or about 100% of a distance corresponding to a thickness of the individual layer of silicon nitride material.

In some embodiments, the silicon nitride material of at least one of the first portion of layers, the second portion of layers, or the third portion of layers may include an oxygen concentration of at least about 5 at. %. An oxygen concentration through the silicon nitride material of at least one of the first portion of layers, the second portion of layers, or the third portion of layers may increase through a thickness of each of the layers of silicon nitride material in a direction towards the interface of the individual layer of silicon nitride material and the overlying layer of silicon oxide material. A refractive index of the silicon nitride material of at least one of the first portion of layers, the second portion of layers, or the third portion of layers may be higher than a refractive index of the other two portions of layers. The refractive index of the silicon nitride of the second portion of layers may be higher than the refractive index of the silicon nitride of the first portion of layers and the silicon nitride of the third portion of layers. The silicon nitride of the first portion of layers may be characterized by a greater dopant concentration than the silicon nitride of the second portion of layers and the third portion of layers. The silicon nitride of the second portion of layers or the silicon nitride of the third portion of layers may be characterized by a greater carbon concentration than the silicon nitride of the first portion of layers. The silicon nitride of the first portion of layers or the silicon nitride of the second portion of layers may be characterized by a greater ratio of nitrogen to silicon than the silicon nitride of the third portion of layers.

Some embodiments of the present technology may encompass methods of forming a semiconductor structure. The methods may include forming a first stack of alternating layers of a silicon oxide material and a silicon nitride material. The methods may include annealing the first stack of alternating layers of the silicon oxide material and the silicon nitride material. The annealing may reduce a hydrogen concentration of the silicon nitride material. The methods may include forming a second stack of alternating layers of a silicon oxide material and a silicon nitride material. The silicon nitride material may be characterized by an oxygen concentration greater than or about 5 at. %.

Such technology may provide numerous benefits over conventional systems and techniques. For example, the processes and structures may protect against defect formation during etching operations. Additionally, the operations of embodiments of the present technology may improve memory hole formation through the stacks. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIGS. 2A-2D illustrate schematic cross-sectional views of substrate materials according to some embodiments of the present technology.

Figure 1:
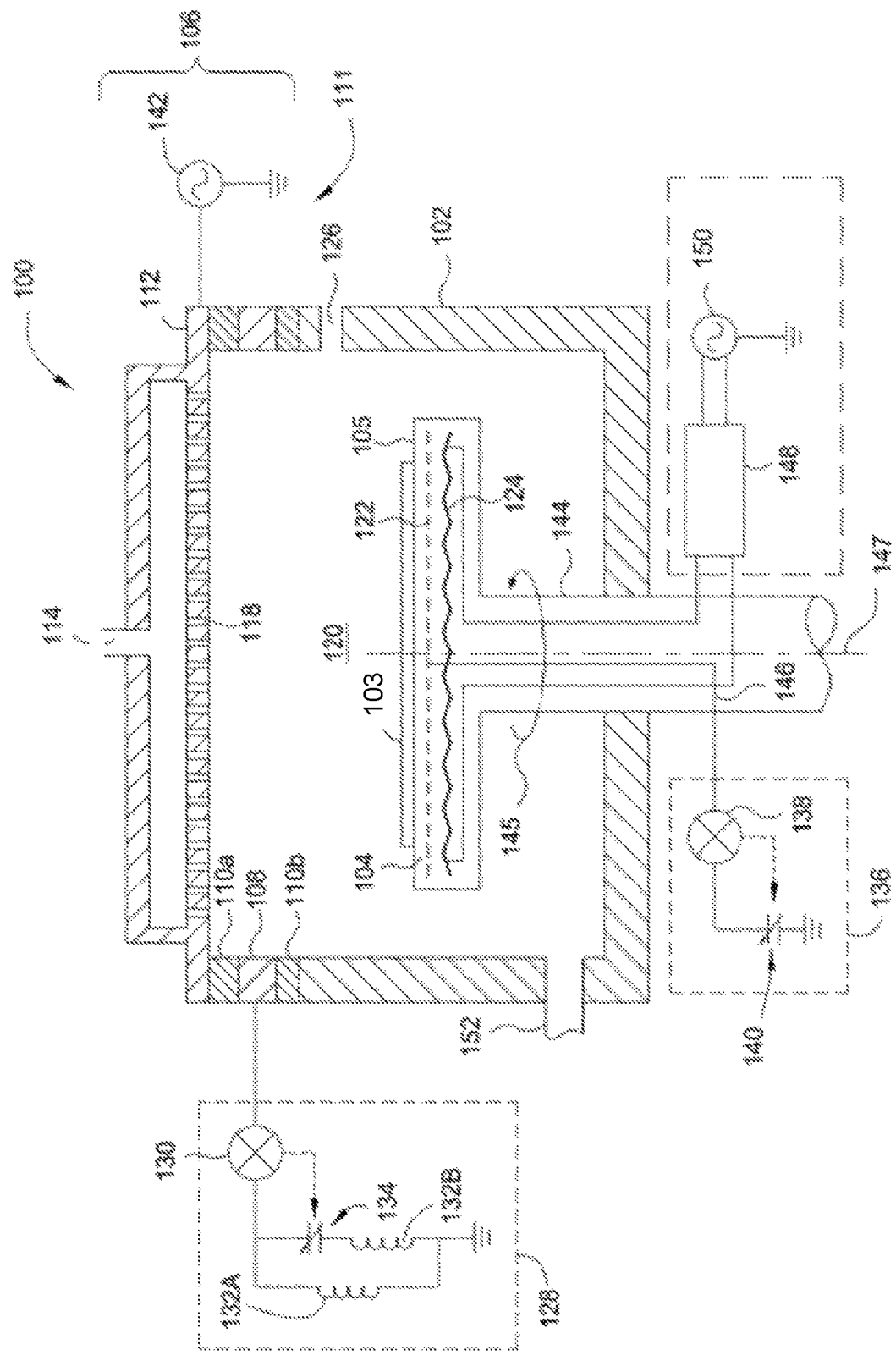
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of memory holes and other structures increase, sometimes dramatically. During 3D NAND processing, stacks of placeholder layers and dielectric materials may form the inter-electrode dielectric or inter-poly dielectric ("IPD") layers. These placeholder layers may have a variety of operations performed to place structures before fully removing the material and replacing it with metal. The IPD layers are often formed overlying a conductor layer, such as polysilicon, for example. When the memory holes are formed, apertures may extend through all of the alternating layers of material before accessing the polysilicon or other material substrate. Subsequent processing may form a staircase structure for contacts, and may also exhume the placeholder materials laterally.

A reactive-ion etching ("RIE") operation may be performed to produce the high aspect ratio memory holes. The RIE process often involves a combination chemical and physical removal of the alternating layers, which may form a carbon polymer layer over sidewalls during etching, and which may protect layers from further etching. As one non-limiting example, where the alternating layers may include silicon oxide and silicon nitride, the silicon oxide may be removed to a greater degree by physical bombardment of the layer during the RIE, and the silicon nitride may be removed to a greater degree by chemical reaction of the RIE precursors with the nitride materials.

Conventional technologies may struggle with uniformity and control during the memory hole formation due to material differences between the two layer types, as well as the RIE process and materials. The present technology overcomes these issues by adjusting material properties prior to the RIE process, which may accommodate or limit one or more challenges that may otherwise occur. Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

FIG. 1 shows a cross-sectional view of an exemplary processing chamber system 100 according to some embodiments of the present technology. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

As described previously, reactive ion etching ("RIE") processes may produce a number of structural effects through stacks of semiconductor materials, which may produce defective devices if not controlled. FIGS. 2A-2D illustrate some structural issues that may occur during memory hole formation. For example, FIG. 2A may show an etching effect known as notching, which may produce sloped defects in silicon nitride layers. The figure includes a structure 200 having a stack 205, which may include multiple portions 210 of alternating layers of materials formed over a substrate 215. Although shown with three portions 210a, 210b, 210c, it is to be understood that stack 205 may include any number of portions in embodiments encompassed by the present technology. Each portion 210 may illustrate four alternating layers of silicon oxide material 212, and silicon nitride material 214. Although four layers are illustrated, it is to be understood that any number of layers may be included in each portion, as well as in the overall stack. Additionally, although illustrated in a particular orientation with silicon nitride being the bottom-most layer, it is to be understood that the layers may be reversed, and may begin with a silicon oxide layer.

As noted above, etching of silicon oxide materials during RIE processes may occur to a greater amount due to ion bombardment, while etching of silicon nitride materials may occur to a greater amount due to chemical reaction between the RIE precursors and the nitride materials. Accordingly, silicon oxide etching may be controlled with control of the RIE beam, and oxide disposed laterally outward from the RIE beam, which may include radially in embodiments, may not be etched. However, nitride materials may be etched based on contact and chemical reaction with the precursors or effluents of the RIE beam. Silicon nitride may also etch more slowly than silicon oxide in some embodiments. Because of hydrogen or other materials associated with silicon nitride, interaction with the effluents of the RIE, which may include carbon, may produce an amount of polymeric material, which may passivate or protect sidewalls of the memory hole to limit lateral etching.

However, at an interface between an oxide material and an underlying layer of silicon nitride material, the amount of polymerization may be minimized. Additionally, the etch rate of silicon nitride may be different than that of silicon oxide, which may create increased exposure or effluent residence time at the nitride layer. Prior to formation of the protective polymerization material, such as at a transition between an oxide layer and a nitride layer, the effluents may react with exposed nitride increasing a lateral etch of the material. As polymer buildup occurs, this lateral etch may taper, and a notch 220 may be formed about the leading edge, in the direction of etch, of the silicon nitride material. This notching may impede or affect formation of subsequent layers or material, and may increase the diameter, or critical dimension, of the memory hole in some embodiments.

FIG. 2B may show an example of striation, both in vertical cross-section 230, and in horizontal cross-section 240 which may affect control of the memory hole formation. Striation may occur when an amount of lateral etching continues layer-to-layer through the structure. For example, in some sense, each layer may operate as a type of mask for an underlying layer. If a lateral defect forms in an overlying layer, this may expose a portion of the underlying layer otherwise to have been maintained, which may be removed. These defects may continue to form, which may continue to increase the critical dimension and cause the memory hole to flare at one or more locations through the stack structure.

FIG. 2C may show an example of stress effects, which may produce memory hole misalignment through a stack. For example, the figure may illustrate a detailed view of a single portion 250 of a stack structure prior to formation of a subsequent stack structure overlying the illustrated alternating layers. The number of alternating layers shown is for illustrative purposes only, and is not intended to limit the number of layers in any particular portion of a stack. Memory holes may be produced through each portion of a stack prior to formation of an overlying portion of the stack. This processing may affect the properties of the pillars, which may be more susceptible to stresses. For example, if a subsequent process exposes the pillars to high temperature, an amount of outgassing can occur. Continuing the example, which is not intended to limit the present technology, silicon nitride may contain an amount of hydrogen depending on the precursors utilized, such as silane in one non-limiting example. When exposed to temperatures above several hundred degrees Celsius, outgassing can occur, which may produce stresses within each pillar, and which may lead to deformation of the structures as illustrated. When an additional stack is being formed above the etched stack, the formation processes may occur at temperatures causing outgassing, which may create offsets of underlying memory holes, which may produce misalignment when overlying memory holes are formed to connect with underlying memory holes.

FIG. 2D may show an example of bowing 260, or widening of a critical dimension within a structure through which RIE may be performed to produce memory holes. Bowing may occur anywhere throughout a structure, and may be caused by a number of issues. For example, bowing may be caused by limited passivation or polymerization on sidewalls, which may allow an amount of lateral etch to occur. Bowing may also occur due to changes with a hardmask material or other structural features. For example, if edges of a hardmask 265 may become eroded during RIE processes, ions may be projected into the feature or memory hole at different directions or angles from normal to the substrate, which may produce additional lateral etching within some regions of the structure until the hardmask taper is removed or etched away. Thus, a number of issues may occur during RIE processes, which may affect memory hole structures in a number of ways. The present technology may include one or more adjustments to material properties of the layers of the stack, which may accommodate, offset, or prevent one or more of the challenges described.

Figure 3:
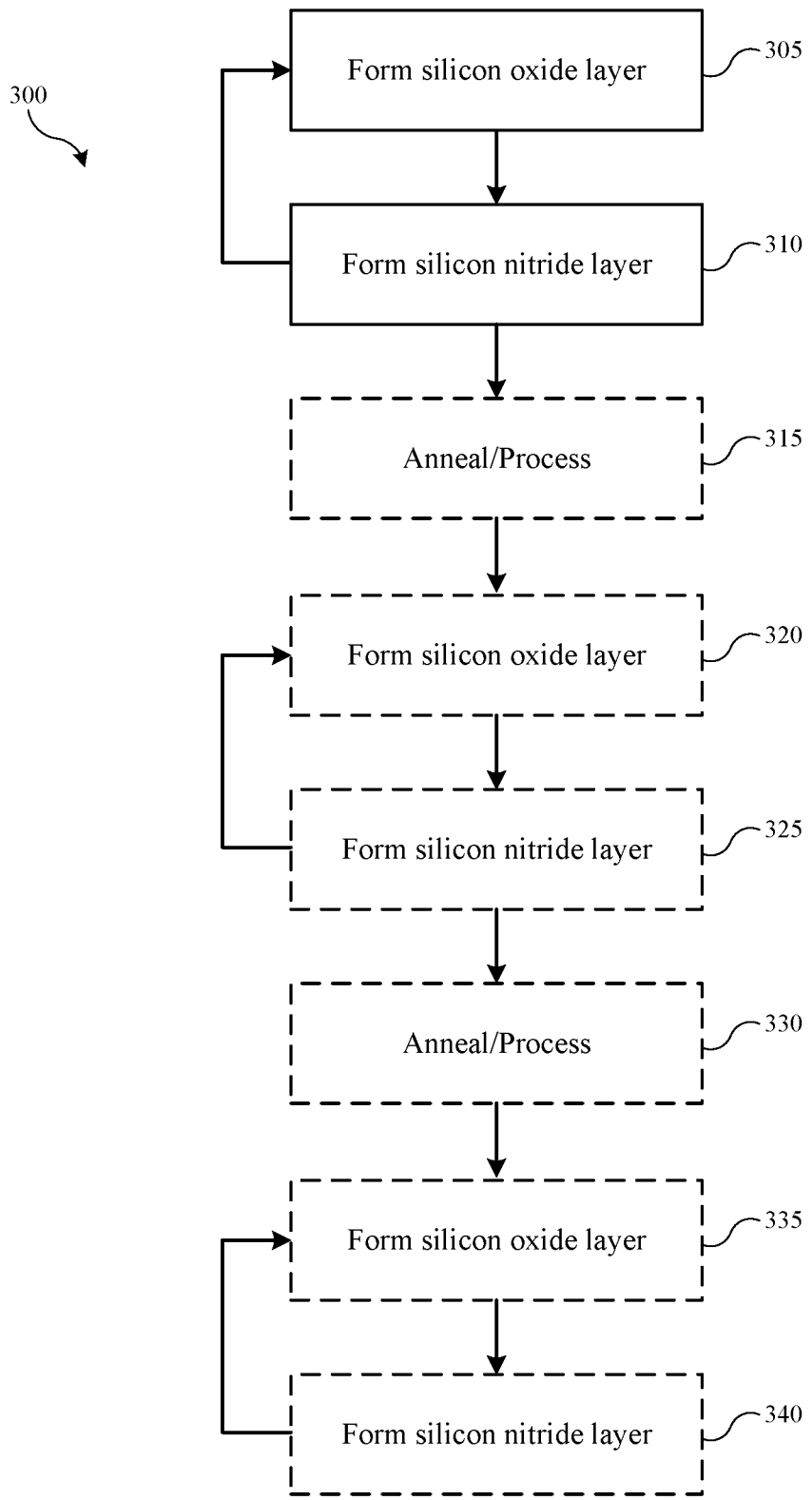
FIG. 3 shows selected operations in a formation method according to some embodiments of the present technology.

The present technology may adjust material properties of one or more layers or materials within exemplary stacks, which may target one or more of the challenges described above. After generally describing a method of forming one or more portions of a semiconductor material stack of layers, adjustments will be discussed, which may be combined or performed in any variation or combination to improve memory hole formation. The chamber 100 discussed previously may be used in performing exemplary methods including formation methods. Turning to FIG. 3 is shown exemplary operations in a method 300 for forming a semiconductor structure according to embodiments of the present technology. Prior to the first operation of the method a substrate may be processed in one or more ways before being placed within a processing region of a chamber in which method 300 may be performed. Some or all of the operations may be performed in chambers or system tools as previously described, or may be performed in different chambers on the same system tool, which may include the chamber in which the operations of method 300 may be performed.

Figure 4A:
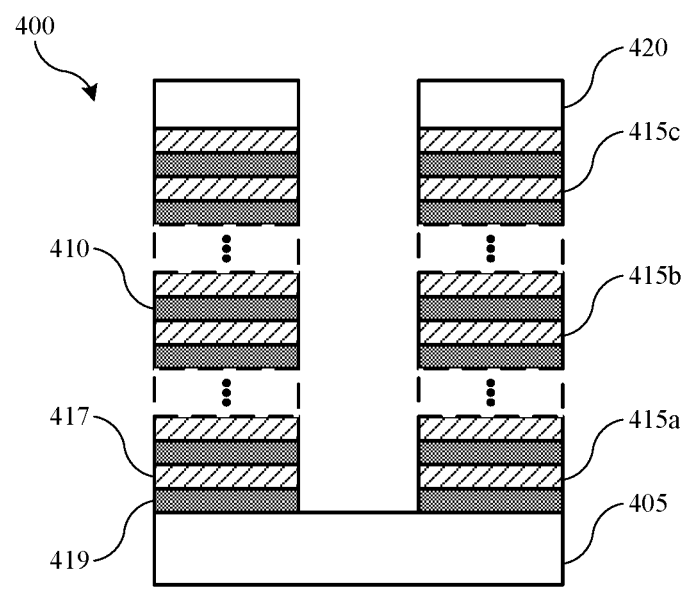
FIGS. 4A-4B illustrate schematic cross-sectional views of substrate materials on which selected operations are being performed according to some embodiments of the present technology.
Figure 4B:
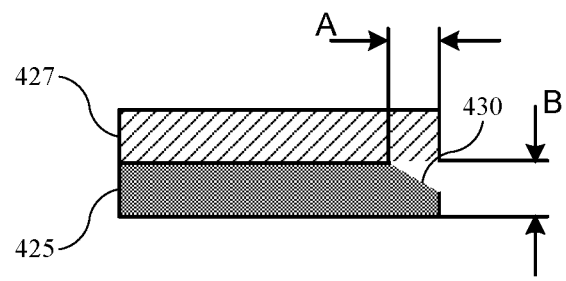

Method 300 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4B, the illustrations of which will be described in conjunction with the operations of method 300. It is to be understood that FIG. 4 illustrates only partial schematic views, and a substrate may contain any number of structural sections having aspects as illustrated in the figures, as well as alternative structural aspects that may still benefit from operations of the present technology.

Structure 400 may illustrate a partial view of a stack of alternating layers of materials, which in some embodiments may be used in 3D NAND memory formation. The alternating layers of material may be produced by any number of methods, including plasma-enhanced chemical vapor deposition, physical vapor deposition, atomic layer deposition, thermally enhanced chemical vapor deposition, or any other formation technique. In some embodiments, plasma-enhanced chemical vapor deposition may be performed in a processing chamber, such as processing chamber 100 described previously. Although the remaining disclosure will discuss stacks of alternating layers of silicon oxide and silicon nitride, embodiments of the present technology may use different combinations of materials, such as silicon oxide and silicon, silicon nitride and silicon, silicon and doped silicon, or any number of other materials. Although the method 300 will discuss formation of silicon oxide followed by formation of silicon nitride, the formation order may be reversed in embodiments similarly encompassed by the present technology. Additionally, any number of layers of material may be produced in a stack, or any portion of any stack, and different portions of a stack may include more, less, or similar numbers of layers of any other portion of a stack according to embodiments of the present technology.

Method 300 may include forming a silicon oxide layer on a substrate at operation 305. The formation may be performed with a silicon-containing precursor and an oxygen-containing precursor. The method may also include forming a silicon nitride layer overlying the silicon oxide layer at operation 310. The formation may be performed with a silicon-containing precursor and a nitrogen-containing precursor. These operations may be repeated any number of times until a predetermined number of pairs of layers may be formed that may constitute a stack of layers. FIG. 4A illustrates a structure 400 including a substrate 405 having a stack 410 of alternating layers of silicon oxide and silicon nitride. The illustrated stack 410 may include a number of portions 415, which may each include at least one layer of silicon oxide material 417, and at least one layer of silicon nitride material 419. Each portion may also include multiple pairs of layers including greater than or about 2 pairs, greater than or about 10 pairs, greater than or about 50 pairs, greater than or about 100 pairs, or more pairs of layers. Any specific number of pairs encompassed by any of these stated ranges is to be understood as if specifically stated here. Although three portions, 415a, 415b, and 415c are illustrated, more or less portions may be included according to some embodiments of the present technology.

In some embodiments, multiple portions, including all portions, may be formed during operations 305 and 310, although in some embodiments the portions may be produced in multiple operations. For example, and as will be described further below, one or more optional operations may be performed between formation of an overlying portion of a stack, or adjustments as will be described below may occur between any of the portions, which may be indicated as a different portion. For example, at optional operation 315, a high temperature anneal may be performed prior to formation of a second portion of the stack. Optional operation 315 may also include formation of a first portion of a memory hole, as well as adjustments to precursors as will be described below. A second portion of the stack may be formed by formation of at least one layer of a silicon oxide material at optional operation 320, and formation of at least one layer of a silicon nitride material at optional operation 325, and which may be repeated to produce any number of pairs of layers similar to the first portion as noted above.

An additional optional operation 330 may include an additional high temperature anneal or formation of a second portion of a memory hole, as well as further adjustments to precursors. A third portion of the stack may be formed by formation of at least one layer of a silicon oxide material at optional operation 335, and formation of at least one layer of a silicon nitride material at optional operation 340, which may also be repeated to produce any number of pairs of layers that may be greater than or less than the number of pairs for either the first portion or the second portion. Any of the silicon oxide materials or silicon nitride materials described below may be included with or be any of the layers of any portion of the stack in some embodiments of the present technology.

A mask material 420 may be formed over any of the portions of the stack prior to forming a portion of a memory hole or other feature through the structure. Structures according to the present technology may be characterized by any aspect ratios or the height-to-width ratio of the structure, although in some embodiments the materials may be characterized by larger aspect ratios, which may increase affects on aspects of the produced structure as described previously. For example, in some embodiments the aspect ratio of exemplary structures, such as the depth of the aperture or memory hole relative to the cross-sectional diameter, may be greater than or about 10:1, greater than or about 20:1, greater than or about 30:1, greater than or about 40:1, greater than or about 50:1, or greater. These high aspect ratios may frustrate many conventional etching operations or produce or exacerbate any of the issues described previously.

Substrate 405 may have a substantially planar surface or an uneven surface in embodiments. The substrate may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 405 may have various dimensions, such as 200 mm or 300 mm diameter wafers, as well as rectangular or square panels. Silicon-containing precursors that may be used during either of the silicon oxide formation or the silicon nitride formation may include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. Oxygen-containing precursors used in any operation as described throughout the present technology may include $O_2$, $N_2O$, $NO_2$, $O_3$, $H_2O$, as well as any other oxygen-containing precursors that may be used in silicon oxide film formation, silicon oxynitride film formation, or other film formation. Nitrogen-containing precursors used in any operation may include $N_2$, $N_2O$, $NO_2$, $NH_3$, $N_2H_2$, as well as any other nitrogen-containing precursor that may be used in silicon nitride film formation. In any of the formation operations one or more additional precursors may be included, such as inert precursors, which may include Ar, He, Xe, Kr, nitrogen, hydrogen, or other precursors.

As noted previously, notching may occur in silicon nitride layers during memory hole formation due to reactive species diffusing laterally through the structure prior to formation of sufficient polymerization. However, in some embodiments, formation of the silicon nitride layer may include incorporation of an amount of oxygen. As described above, the RIE process may occur to a greater degree from bombardment with oxygen, and by incorporating oxygen into the nitride layer to a controlled amount, notching may be reduced or removed in some embodiments. For example, during formation of one or more of the silicon nitride layers in any of the portions of the stack, an oxygen-containing precursor may be flowed with the nitrogen-containing precursor and/or the silicon-containing precursor to produce a film incorporating an amount of oxygen. The oxygen-containing precursor may be any of the oxygen-containing precursors noted above, and in some embodiments may be the same oxygen-containing precursor used in formation of the silicon oxide material. By using the same precursor in some embodiments, fewer modifications may be made during formation of the stack, which may reduce queue times.

In some embodiments one or more of the layers of silicon nitride material may include greater than or about 5 at. % oxygen, and may include greater than or about 10 at. % oxygen, greater than or about 15 at. % oxygen, greater than or about 20 at. % oxygen, greater than or about 25 at. % oxygen, greater than or about 30 at. % oxygen, or more. Additional incorporation of oxygen may affect downstream processes, such as exhuming the silicon nitride layer, and thus in some embodiments the amount of oxygen may be maintained below or about 30 at. % oxygen, below or about 25 at. % oxygen, below or about 20 at. % oxygen, or lower, which may facilitate selective removal of the nitride material during subsequent operations, without compromising the silicon oxide materials. In some embodiments the layers of silicon nitride material may maintain an amount of nitrogen above a threshold, such as greater than or about 20 at. %, and may produce silicon nitride materials characterized by an amount of nitrogen greater than or about 25 at. %, greater than or about 30 at. %, greater than or about 35 at. %, greater than or about 40 at. %, greater than or about 45 at. %, or higher.

As noted above, notching may occur at a leading edge of the silicon nitride materials in a direction of etch towards the substrate. In some embodiments the incorporation of oxygen may be tailored to accommodate this effect. For example, in some embodiments the formation of silicon nitride materials may include formation of a bi-layer of silicon nitride and silicon oxynitride for each layer of silicon nitride. For example, a silicon-containing precursor and a nitrogen-containing precursor may be flowed to produce an amount of silicon nitride, and then an oxygen-containing precursor may be added to the flows, which may include maintaining or adjusting the flow rates of the silicon-containing precursor and/or the nitrogen-containing precursor. Each layer of the bi-layer may constitute any percentage of the bi-layer between about 10% and about 90% of a thickness of the bi-layer.

Whether the oxygen-containing precursor may be added initially during the formation of the silicon nitride material, or added at some time after initial formation, the flow rate of the oxygen-containing precursor may be held constant, may be decreased, or may be increased during formation of the layer. For example, a gradient of oxygen concentration may be produced within the silicon nitrogen material from about 0 at. % oxygen incorporation up to any of the previously noted incorporations. By initiating, and then adjusting, the flow rate of the oxygen-containing precursor, the silicon nitride material may include a gradient of incorporation. For example, the flow rate of the oxygen-containing precursor may be increased during formation of the layer of silicon nitride material, or bi-layer, so a portion of silicon nitride material at an interface of an overlying silicon oxide material may be characterized by an increased amount of oxygen over an underlying portion of the silicon nitride material. Accordingly, a notching effect may be reduced where it is most likely to occur, while maintaining more of a nitride incorporation throughout the film in some embodiments.

The amount of oxygen incorporated in one or more layers of silicon nitride material may also be adjusted between different portions of the stack in some embodiments, and any layer in any portion may be characterized by any amount of oxygen incorporation as noted above, or may remain substantially free of oxygen incorporation. For example, some striation effects and/or profile variation may occur in a second portion of the stack, such as portion 415b, which may be between a first portion 415a and a third portion 415c. By adjusting the oxygen incorporation in the silicon nitride in this portion of the stack, these issues may be limited or resolved. For example, some bowing and striation may occur due to radical effluents of the RIE process laterally etching silicon nitride, which may expose additional silicon oxide and increase an amount of etch on those materials, increasing the effect. By limiting the effect on the nitride materials, the effect on the oxide materials may also be reduced, improving these issues and the uniformity of the memory hole formation. By increasing the oxygen incorporation in the nitride layers in regions where striation and/or bowing may occur, resistance to lateral etch may be increased, which may limit the effects of these issues.

Similarly, memory hole alignment issues may be improved such as by increasing the oxygen concentration in nitride materials in underlying portions of the stack. Silicon oxide may afford improved control on stress effects by reducing an amount of hydrogen within the film, or otherwise affording more control on stress effects, which may limit deformities described previously. Accordingly, in some embodiments, a first portion of the stack may include increased oxygen concentration in the nitride layers, which may reduce stress effects due to outgassing. An optional anneal may also be performed as previously described, which may raise the temperature of the formed films, either with or without increased oxygen concentration in the nitride materials, and which may increase outgassing prior to formation of an additional portion of the stack. The anneal may include a process increasing the temperature of the first portion of the stack greater than or about 500° C., and which may increase the temperature of the first portion of the stack greater than or about 550° C., greater than or about 600° C., greater than or about 650° C., greater than or about 700° C., greater than or about 75° C., greater than or about 800° C., greater than or about 850° C., greater than or about 900° C., or higher. When temperatures exceed about 650° C., for example, an amount of outgassing may occur to limit deformation of the structure to afford improved alignment between portions of a memory hole.

By including an amount of oxygen within the nitride materials, notching can be reduced or removed in some embodiments of the present technology. FIG. 4B illustrates a close-up view of an underlying layer of silicon nitride material 425 and an overlying portion of a silicon oxide material 427, where a notch 430 may be formed. The notch may be characterized by a distance A of intrusion laterally at an interface between the silicon nitride layer and the overlying silicon oxide material. The layer of silicon nitride material may also be characterized by a thickness B. In some embodiments, any particular layer of silicon nitride material may include a notch having a distance A of intrusion that may be less than or about 100% of a distance corresponding to a thickness B. In some embodiments, distance A may be less than or about 75% of distance B, distance A may be less than or about 50% of distance B, distance A may be less than or about 40% of distance B, distance A may be less than or about 30% of distance B, distance A may be less than or about 20% of distance B, distance A may be less than or about 10% of distance B, distance A may be less than or about 5% of distance B, distance A may be less than or about 1% of distance B, or the distance A may be zero, in which no notch may be formed in the layer.

Additional adjustments may be performed to accommodate or adjust the previously described effects, and any of these adjustments may be combined together or with any of the other operations or incorporations discussed elsewhere. For example, the silicon nitride materials may be characterized by a refractive index, which may be adjusted by adjusting film formation materials or conditions. For example, in some embodiments, increasing the refractive index of a silicon nitride material may reduce lateral etch rate or overall dry etch rate. Accordingly, in some embodiments, regions where bowing or striation may occur may be modified by forming silicon nitride layers characterized by increased refractive index over other layers of material. For example, any of the silicon nitride materials may be characterized by a refractive index between about 1.7 and about 2.3. In some embodiments, silicon nitride materials in a lower portion of the structure, such as portion 415a, may be characterized by a refractive index less than silicon nitride materials in a more distal portion of the structure from the substrate. Additionally, silicon nitride materials in a middle portion of the structure, such as portion 415b, may be characterized by a refractive index higher than silicon nitride materials both above and below. Hence, in one non-limiting example, a stack, such as stack 410, may include portions where silicon nitride materials in a third portion 415c may be characterized by a higher refractive index than materials in a first portion 415a, and silicon nitride materials in a second portion 415b may be characterized by a higher refractive index than materials in either third portion 415c or first portion 415a. Any number of other modifications to adjust refractive index may similarly be performed to adjust etching characteristics in various regions of the stack.

Dopant concentrations may also be adjusted in one or more layers of silicon nitride materials in some embodiments of the present technology. For example, silicon nitride may be doped with materials including phosphorus, boron, oxygen, or other materials that may increase etch rate of the silicon nitride materials, which may improve etching, such as in the first portion of the stack, where a taper or narrowing may occur. These dopants may have an affinity to particular materials in an RIE chemistry, which may increase the etching through the portion. Accordingly, incorporating from about 0.01% to about 5% or more of these dopants may increase etching of the materials. Similarly, silicon nitride may be formed with an increased carbon incorporation, which may reduce etching in some portions. Many RIE etchants may include halocarbons, such as chlorocarbons, fluorocarbons, or chloroflouorcarbons, which may have reduced etching of films incorporating an increased amount of carbon relative to films having lower amounts of carbon. Hence, as one non-limiting example, one or more layers or one or more portions of the stack may include an increased carbon concentration, such as between about 1% and about 10%, to control etching. For example, layers of silicon nitride materials in second portion 415b may have increased carbon concentration relative to first portion 415a, in some embodiments.

The ratio of nitrogen to silicon within a layer of silicon nitride material may also be adjusted in some embodiments to affect etch rate. For example, by increasing the ratio of nitrogen to silicon, etch rate of materials may be increased, and by reducing the ratio of nitrogen to silicon, etch rate of materials may be decreased. Accordingly, in some embodiments one or more layers of silicon nitride materials may be characterized by an increased nitrogen to silicon ratio relative to one or more other layers, such as in a first portion, for example, and/or one or more layers of silicon nitride materials may be characterized by a decreased nitrogen to silicon ratio relative to one or more other layers, such as in a second portion, for example. An increased nitrogen to silicon ratio may be greater than or about 1.3, and may be greater than or about 1.4, greater than or about 1.5, greater than or about 1.6, or higher. A decreased nitrogen to silicon ratio may be less than or about 1.3, and may be less than or about 1.2, be less than or about 1.1, be less than or about 1.0, or less.

Adjustments may also be made to layers of silicon oxide materials in some embodiments, which may also affect etch rates and profiles through a stack. For example, in portions where increased etching may be promoted over other layers or portions, such as in a first portion, the silicon-containing precursor may be adjusted to have an increased hydrogen bonding with silicon. As one non-limiting example, while a second portion and/or a third portion of layers of silicon oxide material may be formed using TEOS, a first portion of layers of silicon oxide materials may be formed using silane or disilane, for example, among other precursors having higher amounts of silicon-hydrogen bonding. For portions where reduced etching may be promoted, the opposite may be performed with precursors, and precursors having less silicon-hydrogen bonding may be used, such as in a second portion of a stack. Additionally, precursors including additional carbon may be used, or carbon incorporation within the silicon oxide film may be increased, for the reasons described previously in regard to the etchants used in RIE processing.

By utilizing one or more of the described processes, improved formation of memory holes may be afforded, which may limit effects such as notching, as well as improve uniformity of a profile through the memory hole. For example, in some embodiments, layers or portions through a stack may be characterized by variation in diameter through the memory hole of the stack of less than or about 200%, and may be characterized be variation in diameter through the memory hole of less than or about 150%, less than or about 100%, less than or about 90%, less than or about 80%, less than or about 70%, less than or about 60%, less than or about 50%, less than or about 40%, less than or about 30%, less than or about 20%, less than or about 10%, or less. Consequently, improved fabrication may be afforded by the present technology, which may produce more uniform stack structures over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
    forming a silicon oxide layer from a silicon-containing precursor and an oxygen-containing precursor;
    forming a silicon nitride layer from a silicon-containing precursor, a nitrogen-containing precursor, and an oxygen-containing precursor, wherein the silicon nitride layer is characterized by an oxygen concentration greater than or about 5 at. %, wherein the silicon nitride layer is characterized by a nitrogen concentration greater than or about 40 at. %, and wherein forming the silicon nitride layer comprises:
        flowing the silicon-containing precursor and the nitrogen-containing precursor into a substrate processing region,
        forming an amount of silicon nitride, wherein the amount of silicon nitride is characterized by an oxygen concentration of 0 at. %, and
        adding the oxygen-containing precursor while continuing to form silicon nitride;
    repeating the forming a silicon oxide layer and the forming a silicon nitride layer to produce a stack of alternating layers of silicon oxide and silicon nitride; and
    forming one or more features through the stack of alternating layers of silicon oxide and silicon nitride, wherein a lateral removal of the silicon nitride layer at an interface of the silicon nitride layer and an overlying silicon oxide layer extends a distance less than or about 20% of a distance corresponding to a thickness of the silicon nitride layer.

2. The method of forming a semiconductor structure of claim 1, wherein the oxygen-containing precursor of the forming a silicon oxide layer and the oxygen-containing precursor of the forming a silicon nitride layer is the same precursor.

3. The method of forming a semiconductor structure of claim 1, wherein the stack of alternating layers comprises a first portion of the stack including the silicon oxide layer and the silicon nitride layer and a second portion of the stack overlying the first portion of the stack, and wherein producing the second portion of the stack comprises:
    forming a silicon nitride layer from the silicon-containing precursor and the nitrogen-containing precursor, and an oxygen-containing precursor, wherein the silicon nitride layer is characterized by an oxygen concentration different from the oxygen concentration of the silicon nitride layer in the first portion of the stack.

4. The method of forming a semiconductor structure of claim 1, wherein the oxygen concentration of the silicon nitride layer is between about 10 at. % and about 30 at. %.

5. The method of forming a semiconductor structure of claim 1, wherein the oxygen-containing precursor is flowed at a constant flow rate, and wherein the silicon nitride layer formed comprises a bi-layer of silicon nitride substantially free of oxygen and silicon nitride characterized by an oxygen concentration greater than or about 5 at. %.

6. The method of forming a semiconductor structure of claim 1, wherein the oxygen-containing precursor is flowed at a varying flow rate, and wherein the silicon nitride layer formed comprises a gradient of oxygen concentration through the silicon nitride layer.

7. The method of forming a semiconductor structure of claim 6, wherein a flow rate of oxygen-containing precursor is increased during the adding the oxygen-containing precursor.

8. The method of forming a semiconductor structure of claim 1, wherein the lateral removal of the silicon nitride layer at the interface of the silicon nitride layer and an overlying silicon oxide layer extends a distance less than or about 10% of the distance corresponding to the thickness of the silicon nitride layer.

9. The method of forming a semiconductor structure of claim 1, wherein at least a portion of the silicon nitride layers in the stack of alternating layers of silicon oxide and silicon nitride are characterized by a refractive index of between about 1.7 and about 2.3.

10. The method of forming a semiconductor structure of claim 1, wherein at least a portion of the silicon nitride layers in the stack of alternating layers of silicon oxide and silicon nitride are doped with phosphorus or boron, and wherein the portion of the alternating layers are characterized by a dopant concentration of between about 0.01% and about 5%.

11. A method of forming a semiconductor structure, the method comprising:
    forming a first stack of alternating layers of a silicon oxide material and a silicon nitride material, wherein the silicon nitride material is characterized by a nitrogen concentration greater than or about 40 at. %, and wherein forming the silicon nitride material comprises:
        flowing a silicon-containing precursor and a nitrogen-containing precursor into a substrate processing region,
        forming an amount of the silicon nitride material, wherein the amount of silicon nitride material is characterized by an oxygen concentration of 0 at. %, and
        adding an oxygen-containing precursor while continuing to form silicon nitride;
    annealing the first stack of alternating layers of the silicon oxide material and the silicon nitride material, wherein the annealing reduces a hydrogen concentration of the silicon nitride material; and
    forming a second stack of alternating layers of a silicon oxide material and a silicon nitride material on the annealed first stack of alternating layers of the silicon oxide material and the silicon nitride material, wherein the silicon nitride material in the second stack of alternating layers is characterized by an oxygen concentration different from an oxygen concentration of the silicon nitride material in the first stack of alternating layers.

12. The method of forming a semiconductor structure of claim 11, wherein the silicon nitride material is characterized by an oxygen concentration greater than or about 5 at. %.

* * * * *